(12) United States Patent
Chen et al.

(10) Patent No.: US 10,096,627 B2
(45) Date of Patent: Oct. 9, 2018

(54) PIXEL ARRAY SUBSTRATE

(71) Applicant: E Ink Holdings Inc., Hsinchu (TW)

(72) Inventors: Ya-Rou Chen, Hsinchu (TW); Teng-Yi Shieh, Hsinchu (TW); Po-Chun Chuang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/834,072

(22) Filed: Dec. 7, 2017

(65) Prior Publication Data

US 2018/0158840 A1    Jun. 7, 2018

(30) Foreign Application Priority Data

Dec. 7, 2016    (CN) .......................... 2016 1 1112401

(51) Int. Cl.
*H01L 27/12* (2006.01)
*H01L 27/15* (2006.01)

(52) U.S. Cl.
CPC .......... *H01L 27/124* (2013.01); *H01L 27/153* (2013.01); *H01L 27/156* (2013.01)

(58) Field of Classification Search
CPC .... H01L 27/124; H01L 27/153; H01L 27/156
See application file for complete search history.

(56) References Cited

U.S. PATENT DOCUMENTS

| | | | |
|---|---|---|---|
| 6,429,910 B1* | 8/2002 | Hirata | G02F 1/136204 349/192 |
| 7,105,367 B2* | 9/2006 | Ahn | G02F 1/1309 257/59 |
| 7,768,010 B2* | 8/2010 | Kim | H01L 27/124 257/59 |
| 8,018,428 B2* | 9/2011 | Jung | G02F 1/167 345/107 |
| 8,625,040 B2* | 1/2014 | Iwanami | G02F 1/1345 349/43 |
| 9,869,914 B2* | 1/2018 | Huang | G02F 1/136286 |
| 2008/0122783 A1 | 5/2008 | Jung et al. | |
| 2008/0309613 A1 | 12/2008 | Bae | |
| 2010/0013869 A1* | 1/2010 | Matsumoto | G09G 3/2011 345/690 |
| 2010/0127249 A1 | 5/2010 | Kim et al. | |
| 2010/0155735 A1 | 6/2010 | Park | |
| 2012/0028392 A1 | 2/2012 | Park | |
| 2015/0130751 A1* | 5/2015 | Teraguchi | G02F 1/13338 345/174 |
| 2016/0190228 A1* | 6/2016 | Park | H01L 27/3279 257/40 |

* cited by examiner

*Primary Examiner* — Ida M Soward

(74) *Attorney, Agent, or Firm* — CKC & Partners Co., Ltd.

(57) ABSTRACT

A pixel array substrate includes a display area, signal lines, transmission lines, selection lines, and jumper wires. The selection lines intersect with the signal lines to form intersection regions. The selection lines have first contacts, second contacts, and third contacts. The first contacts are respectively located on the intersection regions. Each of the first contacts is between one of the second contacts and one of the third contacts. A first portion of the first contacts are passed by a line of the display area. The jumper wires respectively pass the first contacts, and two ends of each of the jumper wires are respectively located on one of the second contacts and one of the third contacts. A first portion of the jumper wires electrically connect the first portion of the first contacts and the second contacts, but electrically isolate the third contacts.

10 Claims, 4 Drawing Sheets

PIXEL ARRAY SUBSTRATE

RELATED APPLICATIONS

This application claims priority to China Application Serial Number 201611112401.1, filed Dec. 7, 2016, which is herein incorporated by reference.

BACKGROUND

Field of Invention

The present invention relates to a pixel array substrate.

Description of Related Art

With display panels extensively used in various display devices, such as televisions, notebook computers, tablet computers, electronic papers, and smartphones. Display device with narrow border is a trend in the development of the display industry at the present day.

In order to realize a display device having narrow border, in pixel arrays, signal lines (scan lines or data lines) may extend in a horizontal direction, and selection lines may extend in a vertical direction and connect to the signal lines through contacts to transmit signals to the signal lines from the selection lines. As a result, when a signal is transmitted, the signal may be transmitted to a horizontal signal line from a vertical selection line, and may be further transmitted to pixel regions at the same row passed by each signal line. Such a layout may be referred to as a T-wired design that enables the lines to pass in and out the pixel regions at one side of a display panel and replaces a traditional layout having lines that pass in and out the pixel regions respectively at two sides of a display panel, and hence an area covered by a border may be reduced.

However, the T-wired design may form mura defects at a diagonal line of a display panel when displaying images due to capacitive coupling effects between the selection lines and the pixel regions, thereby affecting image quality of a display device.

SUMMARY

An aspect of the present invention is to provide a pixel array substrate.

According to an embodiment of the present invention, a pixel array substrate includes a display area having pixel areas therein, a plurality of signal lines, a plurality of transmission lines, a plurality of selection lines, and a plurality of jumper wires. The signal lines and the transmission lines intersect with each other to form the pixel areas. The selection lines pass the pixel areas and intersect with the signal lines to form a plurality of intersection regions. The selection lines have a plurality of first contacts, a plurality of second contacts adjacent to the first contacts, and a plurality of third contacts adjacent to the first contacts. The first contacts are respectively located on the intersection regions. Each of the first contacts is between one of the second contacts and one of the third contacts. A first portion of the first contacts are passed by a line of the display area. The jumper wires respectively pass the first contacts, and two ends of each of the jumper wires are respectively located on one of the second contacts and one of the third contacts. A first portion of the jumper wires electrically connect the first portion of the first contacts and the second contacts that are adjacent to the first portion of the first contacts, but electrically isolate the third contacts that are adjacent to the first portion of the first contacts.

In one embodiment of the present invention, the pixel array substrate further includes an isolation layer. The isolation layer covers the selection lines and has a plurality of openings. The first portion of the first contacts and the second contacts adjacent to the first portion of the first contacts are located in the openings, and the first portion of the jumper wires are in contact with the first contacts and the second contacts that are in the openings.

In one embodiment of the present invention, the pixel array substrate further includes a plurality of insulators. The insulators are located between the isolation layer and the first portion of the jumper wires, and correspond to the third contacts adjacent to the first portion of the first contacts in position.

In one embodiment of the present invention, a width of each of the insulators is substantially the same as that of each of the openings.

In one embodiment of the present invention, a second portion of the first contacts are located at one side of the line, and a second portion of the jumper wires electrically connect the second contacts and the third contacts that are adjacent to the second portion of the first contacts, but the second portion of the jumper wires electrically isolate the second portion of the first contacts.

In one embodiment of the present invention, the pixel array substrate further includes an isolation layer. The isolation layer covers the selection lines and has a plurality of openings. The second contacts and the third contacts adjacent to the second portion of the first contacts are located in the openings, and the second portion of the jumper wires are in contact with the second contacts and the third contacts that are in the openings.

In one embodiment of the present invention, the pixel array substrate further includes a plurality of insulators. The insulators are located between the isolation layer and the second portion of the jumper wires, and correspond to the second portion of the first contacts in position.

In one embodiment of the present invention, a third portion of the first contacts are located at one side of the line, and a third portion of the jumper wires electrically isolate the third portion of the first contacts, the second contacts and the third contacts that are adjacent to the third portion of the first contacts.

In one embodiment of the present invention, the pixel array substrate further includes an isolation layer and a plurality of insulators. The isolation layer covers the selection lines. The insulators are located between the isolation layer and the third portion of the jumper wires, and correspond to the third portion of the first contacts, the second contacts and the third contacts that are adjacent to the third portion of the first contacts in position.

In one embodiment of the present invention, the signal lines are data lines or scan lines.

In the aforementioned embodiments of the present invention, although a diagonal line (i.e., the straight line) of the display area passes the first contacts, the selection lines further have the second contacts and the third contacts adjacent to the first contacts. Therefore, the jumper wires may electrically connect the first contacts and the second contacts, but electrically isolate the third contacts. As a result, signals transmitted by the selection lines may be send to the first contacts through the second contacts and the jumper wires, and the first contacts are respectively located on the intersection regions formed by the selection lines and the signal lines, and hence the signals may be transmitted to the signal lines. Since the third contacts adjacent to the first contacts passed by the diagonal line electrically isolate the jumper wires, the selection lines at one side of the diagonal line of the display area do not transmit signals. Accordingly, when the pixel array substrate displays images, the configuration can prevent mura defects from forming at the diagonal line, thereby improving image quality of a display device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
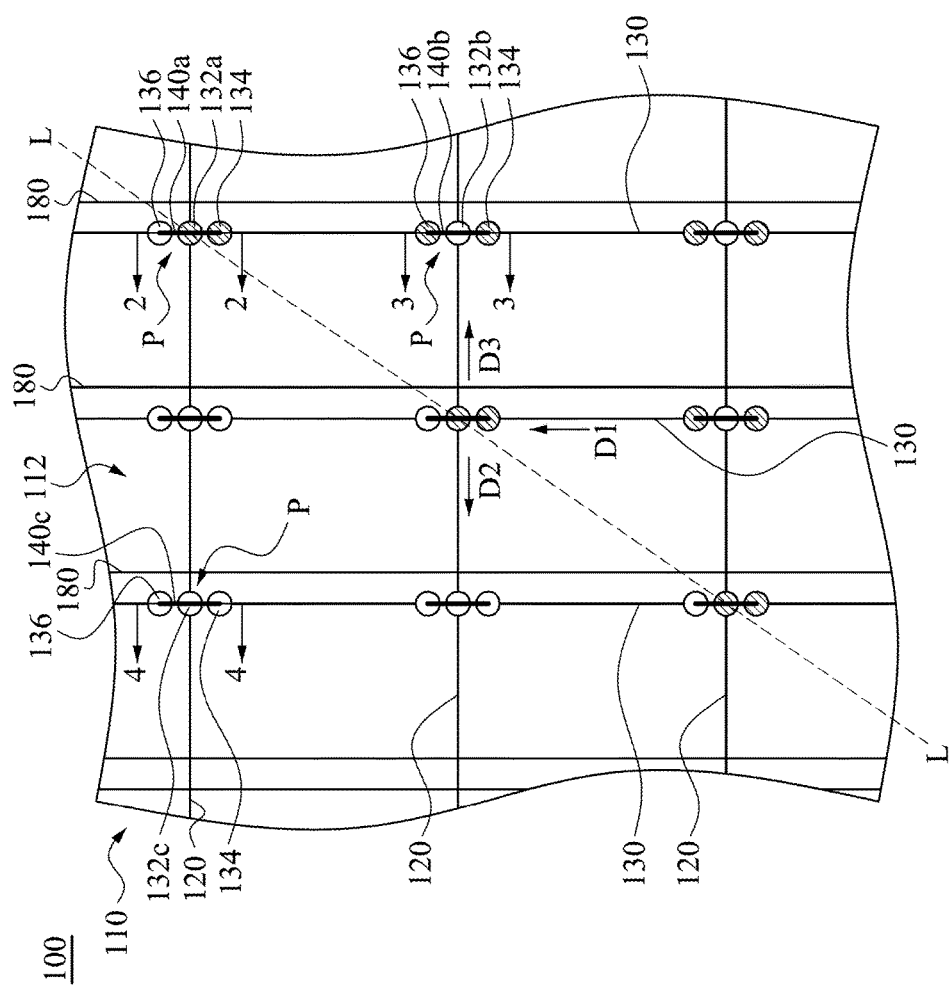
FIG. 1 is a partially enlarged view of a display area of a pixel array substrate according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a partially enlarged view of a display area 110 of a pixel array substrate 100 according to one embodiment of the present invention. As shown in FIG. 1, the pixel array substrate 100 includes the display area 110, a plurality of signal lines 120, a plurality of transmission lines 180, a plurality of selection lines 130, and a plurality of jumper wires 140a, 140b, and 140c. The display area 110 has a plurality of pixel areas 112 therein, and the pixel areas 112 are formed by the signal lines 120 and the transmission lines 180 intersecting with each other. The selection lines 130 pass the pixel areas 112 and intersect with the signal lines 120 to form a plurality of intersection regions P. For example, the selection lines 130 are substantially perpendicular to the signal lines 120. The selection lines 130 have a plurality of first contacts 132a, 132b, 132c, a plurality of second contacts 134, and a plurality of third contacts 136. A first portion of the first contacts 132a are passed by a diagonal line L of the display area 110, a second portion of the first contacts 132b are located at one side of the diagonal line L (e.g., at the lower side or the right side of the diagonal line L), and a third portion of the first contacts 132c are located at another side of the diagonal line L (e.g., at the upper side or the left side of the diagonal line L). Moreover, each of the first contacts 132a, 132b, and 132c is adjacent to and between one of the second contacts 134 and one of the third contacts 136. The first contacts 132a, 132b, and 132c are respectively located on the intersection regions P of the selection lines 130 and the signal lines 120. In an exemplary embodiment, the diagonal line L may be defined as a line passing one of the first contacts 132a on each of the selection lines 130 in the display area 110.

A first portion of the jumper wires 140a pass the first contacts 132a, a second portion of the jumper wires 140b pass the first contacts 132b, and a third portion of the jumper wires 140c pass the first contacts 132c. Throughout the specification, "the jumper wires pass the first contacts" is referred to as the jumper wires extending over the first contacts, and the jumper wires may electrically connect the first contacts or may electrically isolate the first contacts. In addition, two ends of each of the jumper wires 140a, 140b, and 140c are respectively located on one of the second contacts 134 and one of the third contacts 136. The jumper wires 140a electrically connect the first contacts 132a and the second contacts 134 adjacent to the first contacts 132a, but electrically isolate the third contacts 136 adjacent to the first contacts 132a. In FIG. 1, the contacts with oblique lines are referred to as the contacts electrically connect the jumper wires, and the void contacts are referred to as the contacts electrically isolate the jumper wires.

In the pixel array substrate 100, although the diagonal line L of the display area 110 passes the first contacts 132a, the selection lines 130 further have the second contacts 134 and the third contacts 136 adjacent to the first contacts 132a. Therefore, the jumper wires 140a may electrically connect the first contacts 132a and the second contacts 134, but electrically isolate the third contacts 136. As a result, signals transmitted in a direction D1 by the selection lines 130 may be send to the first contacts 132a through the second contacts 134 and the jumper wires 140a, and the first contacts 132a are respectively located on the intersection regions P formed by the selection lines 130 and the signal lines 120, and hence the signals may be transmitted to the signal lines 120 such that the signal lines 120 can transmit the signals in directions D2 and D3 to the pixel regions 112 at the same row passed by each signal line 120. Since the third contacts 136 adjacent to the first contacts 132a passed by the diagonal line L electrically isolate the jumper wires 140a, the selection lines 130 at one side of the diagonal line L of the display area 110 (e.g., at the upper side or the left side of the diagonal line L) do not transmit signals in the direction D1. Accordingly, when the pixel array substrate 100 displays images, the configuration can prevent mura defects from forming at the diagonal line L, thereby improving image quality of a display device.

In manufacturing the pixel array substrate 100 through automated optical inspection (AOI), the equipment would check whether line structures adjacent to the intersection regions P are the same. If the line structures are different, the equipment will judge the line structures have defects. In this embodiment, the jumper wires 140b electrically connect the second contacts 134 and the third contacts 136 adjacent to the first contacts 132b, but electrically isolate the first contacts 132b. The jumper wires 140c electrically isolate the first contacts 132c, the second contacts 134, and the third contacts 136 adjacent to the first contacts 132c. As a result, the line structures respectively in the pixel regions 112 have the same design. For example, each of the pixel regions 112 has one signal line 120 and one selection line 130 intersecting with the signal line 120, and there are three adjacent contacts and one jumper wire adjacent to each intersection region P, such that the line structures adjacent to the intersection regions P of the signal lines 120 and the selection lines 130 are the same. Therefore, the line structures can pass the automated optical inspection, and prevent the equipment from judging error detection, thereby ensuring deserved product yield of the pixel array substrate 100.

In this embodiment, the signal lines 120 electrically connect gate electrodes of the pixel array substrate 100, and hence the signal lines 120 are scan lines (or gate lines). The signal lines 120 utilize the first contacts 132a to electrically connect the selection lines 130 and transmit signals to the gate electrodes.

It is to be noted that the connection relationships of the elements described above will not be repeated hereinafter. In the following description, cross-sectional structures of the pixel array substrate 100 will be described.

Figure 2:
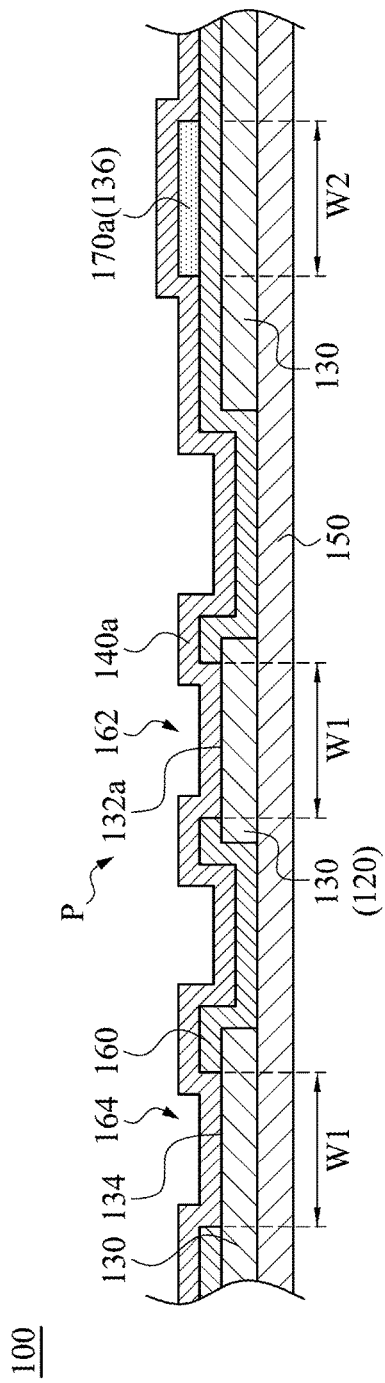
FIG. 2 is a cross-sectional view of the pixel array substrate taken along line 2-2 shown in FIG. 1.

FIG. 2 is a cross-sectional view of the pixel array substrate 100 taken along line 2-2 shown in FIG. 1. As shown in FIG. 1 and FIG. 2, the pixel array substrate 100 further includes an isolation layer 160. The isolation layer 160, the selection lines 130, and the signal lines 120 are located on a substrate 150. The isolation layer 160 covers the selection lines 130 and has a plurality of openings 162 and 164. The selection lines 130 are exposed through the openings 162 and 164, and the exposed portions of the selection lines 130 are used as the first contacts 132a and the second contacts 134 of FIG. 1. In other words, the first contacts 132a are located in the openings 162 of the isolation layer 160, and the second contacts 134 adjacent to the first contacts 132a are located in the openings 164 of the isolation layer 160. The jumper wires 140a are in contact with the first contacts 132a in the openings 162, and are in contact with the second contacts 134 in the openings 164.

Furthermore, the pixel array substrate 100 further includes a plurality of insulators 170a. The insulators 170a are located between the isolation layer 160 and the jumper wires 140a, and correspond to the third contacts 136 adjacent to the first contacts 132a in position. That is, the insulators 170a is used as the third contacts 136 of FIG. 1, and do not electrically conduct the jumper wires 140a and the selection lines 130, and are used as false contacts. In this embodiment, a width W2 of each of the insulators 170a is substantially the same as a width W1 of each of the openings 162 and 164.

In this embodiment, the substrate 150 may be flexible, and is made of a material including polymer. An electronic ink (e-ink) layer and front plane laminate (FPL) may be disposed above the pixel array substrate 100, and can be used in a foldable display device, such as an electronic paper (e-paper) display device.

Figure 3:
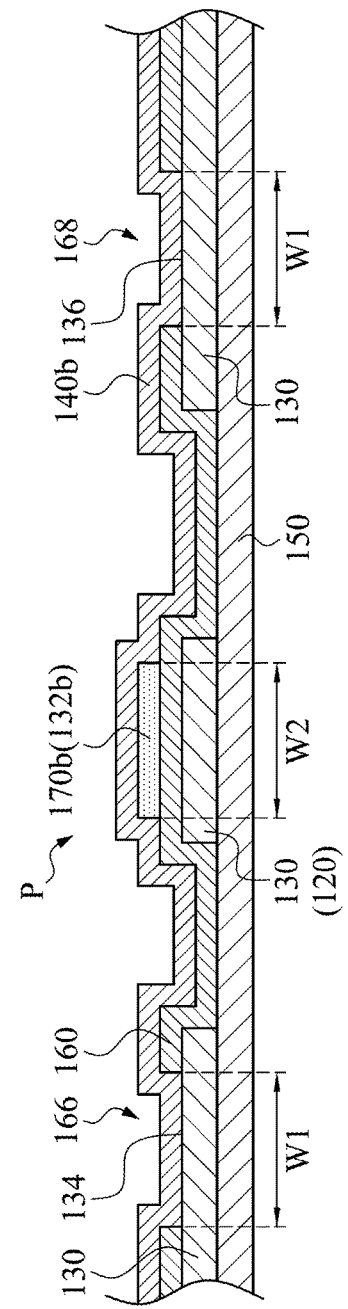
FIG. 3 is a cross-sectional view of the pixel array substrate taken along line 3-3 shown in FIG. 1.

FIG. 3 is a cross-sectional view of the pixel array substrate 100 taken along line 3-3 shown in FIG. 1. As shown in FIG. 1 and FIG. 3, the isolation layer 160 has a plurality of openings 166 and 168. The selection lines 130 are exposed through the openings 166 and 168, and the exposed portions of the selection lines 130 are used as the second contacts 134 and the third contacts 136 of FIG. 1 adjacent to the first contacts 132b. In other words, the second contacts 134 adjacent to the first contacts 132b are located in the openings 166 of the isolation layer 160, and the third contacts 136 adjacent to the first contacts 132b are located in the openings 168 of the isolation layer 160. The jumper wires 166 are in contact with the second contacts 134 in the openings 166 and are in contact with the third contacts 136 in the openings 168.

Furthermore, the pixel array substrate 100 further includes a plurality of insulators 170b. The insulators 170b are located between the isolation layer 160 and the jumper wires 140b, and correspond to the first contacts 132b in position. That is, the insulators 170b is used as the first contacts 132b of FIG. 1, and do not electrically conduct the jumper wires 140b and the selection lines 130, and are used as false contacts. In this embodiment, a width W2 of each of the insulators 170b is substantially the same as a width W1 of each of the openings 166 and 168.

Figure 4:
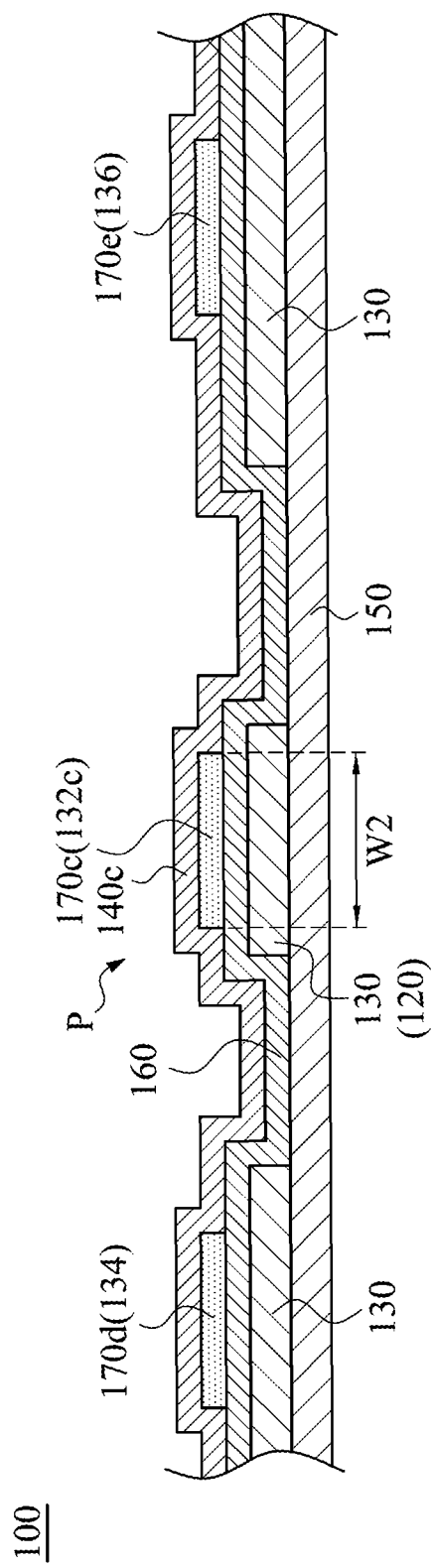
FIG. 4 is a cross-sectional view of the pixel array substrate taken along line 4-4 shown in FIG. 1.

FIG. 4 is a cross-sectional view of the pixel array substrate 100 taken along line 4-4 shown in FIG. 1. As shown in FIG. 1 and FIG. 4, the pixel array substrate 100 further includes a plurality of insulators 170c, 170d, and 170e. The insulators 170c, 170d, and 170e are located between the isolation layer 160 and the jumper wires 140c. The insulators 170c correspond to the first contacts 132c in position, the insulators 170d correspond to the second contacts 134 adjacent to the first contacts 132c in position, and the insulators 170e correspond to the third contacts 136 adjacent to the first contacts 132c in position. In other words, the insulators 170c, 170d, and 170e are respectively used as the first contacts 132c, the second contacts 134 adjacent to the first contacts 132c, and the third contacts 136 adjacent to the first contacts 132c of FIG. 1. The insulators 170c, 170d, and 170e do not electrically conduct the jumper wires 140c and the selection lines 130, and are used as false contacts. In this embodiment, the insulators 170c, 170d, and 170e have the same width W2.

Figure 5:
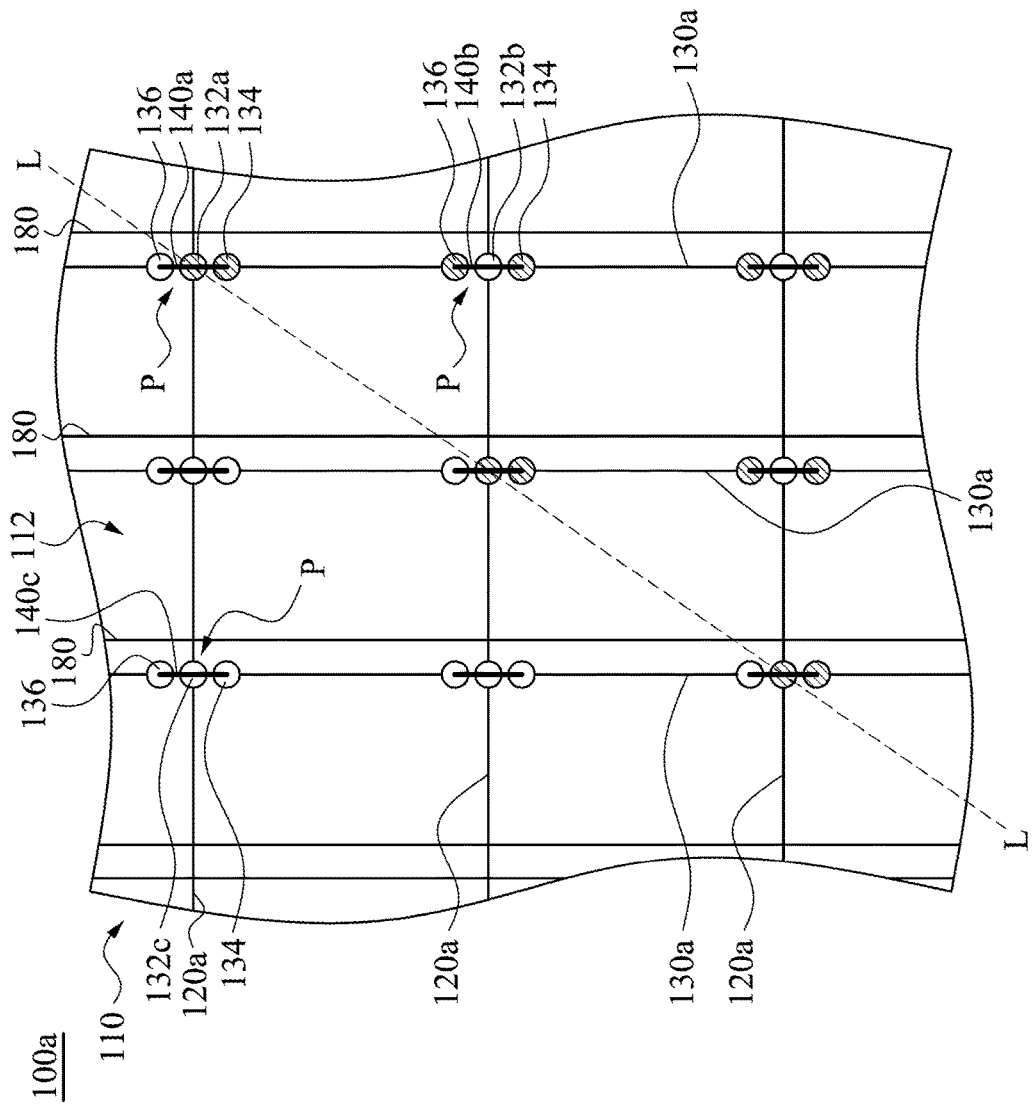
FIG. 5 is a partially enlarged view of a display area of a pixel array substrate according to one embodiment of the present invention.

FIG. 5 is a partially enlarged view of the display area 110 of a pixel array substrate 100a according to one embodiment of the present invention. The pixel array substrate 100a includes the display area 110, a plurality of signal lines 120a, a plurality of selection lines 130a, and the jumper wires 140a, 140b, and 140c. The difference between this embodiment and the embodiment shown in FIG. 1 is that the signal lines 120a electrically connect source electrodes of the pixel array substrate 100a, and hence the signal lines 120a are data lines. The signal lines 120a utilize the first contacts 132a to electrically connect the selection lines 130a and transmit signals to the source electrodes.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A pixel array substrate, comprising:
   a display area having a plurality of pixel areas therein;
   a plurality of signal lines and a plurality of transmission lines intersecting with each other to form the pixel areas;
   a plurality of selection lines passing the pixel areas, intersecting with the signal lines to form a plurality of intersection regions, and having a plurality of first contacts, a plurality of second contacts adjacent to the first contacts, and a plurality of third contacts adjacent to the first contacts, wherein the first contacts are respectively located on the intersection regions, and each of the first contacts is between one of the second contacts and one of the third contacts, and a first portion of the first contacts are passed by a line of the display area; and
   a plurality of jumper wires respectively passing the first contacts, wherein two ends of each of the jumper wires are respectively located on one of the second contacts and one of the third contacts, and a first portion of the jumper wires electrically connect the first portion of the first contacts and the second contacts that are adjacent to the first portion of the first contacts, but electrically isolate the third contacts that are adjacent to the first portion of the first contacts.

2. The pixel array substrate of claim 1, further comprising:
an isolation layer covering the selection lines and having a plurality of openings, wherein the first portion of the first contacts and the second contacts adjacent to the first portion of the first contacts are located in the openings, and the first portion of the jumper wires are in contact with the first contacts and the second contacts that are in the openings.

3. The pixel array substrate of claim 2, further comprising:
a plurality of insulators located between the isolation layer and the first portion of the jumper wires, and corresponding to the third contacts adjacent to the first portion of the first contacts in position.

4. The pixel array substrate of claim 3, wherein a width of each of the insulators is substantially the same as that of each of the openings.

5. The pixel array substrate of claim 1, wherein a second portion of the first contacts are located at one side of the line, and a second portion of the jumper wires electrically connect the second contacts and the third contacts that are adjacent to the second portion of the first contacts, but the second portion of the jumper wires electrically isolate the second portion of the first contacts.

6. The pixel array substrate of claim 5, further comprising:
an isolation layer covering the selection lines and having a plurality of openings, wherein the second contacts and the third contacts adjacent to the second portion of the first contacts are located in the openings, and the second portion of the jumper wires are in contact with the second contacts and the third contacts that are in the openings.

7. The pixel array substrate of claim 6, further comprising:
a plurality of insulators located between the isolation layer and the second portion of the jumper wires, and corresponding to the second portion of the first contacts in position.

8. The pixel array substrate of claim 1, wherein a third portion of the first contacts are located at one side of the line, and a third portion of the jumper wires electrically isolate the third portion of the first contacts, the second contacts and the third contacts that are adjacent to the third portion of the first contacts.

9. The pixel array substrate of claim 8, further comprising:
an isolation layer covering the selection lines; and
a plurality of insulators located between the isolation layer and the third portion of the jumper wires, and corresponding to the third portion of the first contacts, the second contacts and the third contacts that are adjacent to the third portion of the first contacts in position.

10. The pixel array substrate of claim 1, wherein the signal lines are data lines or scan lines.

* * * * *